(12) United States Patent  
Edmonson et al.

(10) Patent No.: US 9,337,378 B2  
(45) Date of Patent: May 10, 2016

(54) SYSTEM AND METHOD FOR PHOTOVOLTAIC DEVICE TEMPERATURE CONTROL WHILE CONDITIONING A PHOTOVOLTAIC DEVICE

(71) Applicant: First Solar, Inc., Perrysburg, OH (US)

(72) Inventors: Scott Edmonson, San Jose, CA (US); Yacov Elgar, Sunnyvale, CA (US); Dhruv Gajaria, Sunnyvale, CA (US); Weston Gerwin, Perrysburg, OH (US); Scott Jacoby, Sylvania, OH (US); Imran Khan, Perrysburg, OH (US); Anthony Maher, Perrysburg, OH (US); Stephen P. Murphy, Perrysburg, OH (US); Gregory A. Ritz, Berkey, OH (US)

(73) Assignee: First Solar, Inc., Perrysburg, OH (US)

( * ) Notice: Subject to any disclaimer, the term of this patent is extended or adjusted under 35 U.S.C. 154(b) by 0 days.

(21) Appl. No.: 14/661,646

(22) Filed: Mar. 18, 2015

(65) Prior Publication Data  
US 2015/0194564 A1    Jul. 9, 2015

Related U.S. Application Data

(60) Division of application No. 13/836,449, filed on Mar. 15, 2013, which is a continuation-in-part of application No. 13/035,594, filed on Feb. 25, 2011, now Pat. No. 8,431,427.

(60) Provisional application No. 61/309,064, filed on Mar. 1, 2010.

(51) Int. Cl.  
*H01L 31/18* (2006.01)  
*H01L 31/048* (2014.01)  
(Continued)

(52) U.S. Cl.  
CPC ............ *H01L 31/186* (2013.01); *H01L 31/048* (2013.01); *H01L 31/18* (2013.01); *H01L 31/1864* (2013.01); *H02S 50/10* (2014.12); *H01L 31/03767* (2013.01); *Y02E 10/50* (2013.01); *Y02P 70/521* (2015.11)

(58) Field of Classification Search  
None  
See application file for complete search history.

(56) References Cited

U.S. PATENT DOCUMENTS

| | | |
|---|---|---|
| 3,303,059 A | 2/1967 | Kerr et al. |
| 3,333,326 A | 8/1967 | Thomas et al. |
| 3,436,275 A | 4/1969 | Tsao et al. |

(Continued)

FOREIGN PATENT DOCUMENTS

| | | |
|---|---|---|
| GB | 1089076 A | 11/1967 |
| WO | WO-2011/109227 A1 | 9/2011 |

(Continued)

OTHER PUBLICATIONS

Chinese Office Action dated Sep. 2, 2014 201180012175.9 w/English Translation (26 pages).

(Continued)

*Primary Examiner* — Scott B Geyer  
(74) *Attorney, Agent, or Firm* — Blank Rome LLP

(57) ABSTRACT

A system and method for applying an electrical bias to a photovoltaic device in a temperature control chamber, in which the temperature of the photovoltaic device is controlled according to a temperature profile. The temperature profile may include at least one hot phase and at least one cool phase.

20 Claims, 12 Drawing Sheets

(51) Int. Cl.
*H02S 50/10* (2014.01)
*H01L 31/0376* (2006.01)

(56) References Cited

U.S. PATENT DOCUMENTS

| | | | |
|---|---|---|---|
| 4,395,293 A * | 7/1983 | Knechtli et al. | 438/4 |
| 6,288,325 B1 | 9/2001 | Jansen et al. | |
| 7,163,608 B2 | 1/2007 | Stanbery | |
| 8,263,176 B2 * | 9/2012 | Herguth et al. | 427/74 |
| 8,278,937 B2 * | 10/2012 | Vasilyev et al. | 324/537 |
| 2004/0115377 A1 | 6/2004 | Wei et al. | |
| 2006/0286785 A1 | 12/2006 | Rogers et al. | |
| 2009/0087219 A1 | 4/2009 | Aoshima et al. | |
| 2009/0127448 A1 | 5/2009 | Fuyuki | |
| 2010/0236035 A1 * | 9/2010 | Chung | 29/25.01 |
| 2011/0204909 A1 * | 8/2011 | Buehler et al. | 324/750.03 |
| 2012/0024336 A1 * | 2/2012 | Hwang | 136/244 |
| 2012/0223733 A1 * | 9/2012 | Gunawan et al. | 324/761.01 |
| 2013/0175005 A1 * | 7/2013 | Gowdaru et al. | 165/84 |

FOREIGN PATENT DOCUMENTS

| | | |
|---|---|---|
| WO | WO-2012/143892 A2 | 10/2012 |
| WO | WO-2013/112551 A2 | 8/2013 |

OTHER PUBLICATIONS

International Preliminary Report on Patentability issued in corresponding International Application No. PCT/US2011/026136 on Sep. 13, 2012.

Nowlan et al., "Post-Lamination Manufacturing Process Automaton for Photovoltaic Modules", Final Subcontract Report, National Renewable Energy Laboratory, Nov. 2002, retrieved Apr. 9, 2011. Retrieved from http://www.nrel.gov/docs/fy30osti/32943.pdg>.

Vijh, A, "Triple Junction Amorphous Silicon based Flexible Photovoltaic Submodules on Polymide Substrates", The University of Toledo, Jul. 2005, retrieved on Apr. 10, 2001. Retrieved from http://etd.ohiolink.edu/send.pdf.cgi/Vijh%20Aarohi.pdf?toledo1122656006>.

* cited by examiner

SYSTEM AND METHOD FOR PHOTOVOLTAIC DEVICE TEMPERATURE CONTROL WHILE CONDITIONING A PHOTOVOLTAIC DEVICE

CLAIM OF PRIORITY

This application is a divisional of U.S. patent application Ser. No. 13/836,449, filed Mar. 15, 2013, which is a continuation-in-part of, and claims priority to, U.S. application Ser. No. 13/035,594, filed Feb. 25, 2011, now U.S. Pat. No. 8,431,427, which claims priority to U.S. Provisional Patent Application No. 61/309,064, filed on Mar. 1, 2010, the entirety of each of which is hereby incorporated by reference.

TECHNICAL FIELD

This disclosure relates generally to photovoltaic devices, and more specifically, to a system and method for conditioning photovoltaic devices.

BACKGROUND OF THE INVENTION

Photovoltaic (PV) devices are PV cells or PV modules or any device that converts photo-radiation into electrical current (note that a PV module is made of a plurality of PV cells). Generally, a thin film PV device includes two conductive electrodes sandwiching a series of semiconductor layers. The semiconductor layers provide a p-n junction at or near which the photo-conversion occurs. In thin film PV devices, the p-n junction is typically formed by an n-type window layer and a p-type absorber layer. During operation of a thin film PC device, photons pass through the layers of the PV device, including the window layer, and are absorbed by the absorber layer. The absorber layer produces photo-generated electron-hole pairs from the photons, the movement of which, promoted by a built-in electric field, produces electric current that can be output to other electrical devices through the two electrodes.

During the manufacture of PV devices, conditioning of PV devices can be used to improve the conversion efficiency of the PV device. An improved system and method of conditioning PV devices during and/or after manufacture to achieve desired performance characteristics and product specifications is needed.

DETAILED DESCRIPTION

Figure 1:
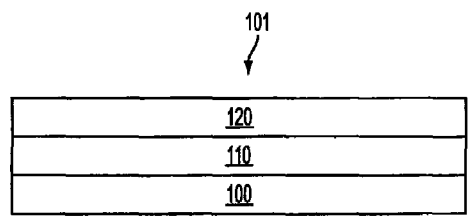
FIG. 1 is a cross-section of a PV device.

In the following detailed description, reference is made to the accompanying drawings which form a part hereof, and in which is shown by way of illustration specific embodiments that provide a system and method for inline testing and conditioning of PV devices while they are manufactured. These embodiments are described in sufficient detail to enable those skilled in the art to make and use them, and it is to be understood that structural, logical, or procedural changes may be made to the specific embodiments disclosed without departing from the spirit and scope of the invention.

Thin film PV devices can include multiple layers formed on a substrate (or superstrate). For example, a PV device can include a barrier layer over a glass substrate, a transparent conductive oxide (TCO) layer over the barrier layer, a buffer layer over the TCO layer, a semiconductor window layer over the buffer layer, and a semiconductor absorber layer over the window layer, all formed in a stack on the substrate. Each layer may in turn include more than one layer or film. Additionally, each layer can cover all or a portion of the PV device and/or all or a portion of the layer or substrate underlying the layer. For example, a "layer" can mean any amount of any material that contacts all or a portion of a surface.

Thin film solar cells such as those including copper-indium-gallium-selenium (CIGS), cadmium telluride (CdTe), and amorphous silicon (a-Si) as absorber layers often show changes in their current-voltage behavior after light exposures of extended periods of time (>0.5 hr-days). Some structures such as CIGS solar cells show transient degradation that is fully reversible. Some structures such as a-Si solar cells show degradation that is not reversible, often referred to as stabilization. In CdTe solar cells, both phenomena have been observed where efficiency increases and stabilizes or decreases after brief exposure to light. Increasing the temperature of the device during light exposure can also accelerate these changes. A manufacture method and related system are developed as an alternative to using light exposure to condition and stabilize the current-voltage behavior of thin film PV devices, thereby improving their long term efficiency.

The application of an external electrical power supply that creates a bias in the PV device can be sufficient to induce PV device current-voltage behavior changes which stabilize at a desired current-voltage behavior for long-term efficiency. The stabilized current-voltage behavior in a PV device can be achieved under a constant electrical current load while the device is held at an elevated temperature. Increasing the temperature while under a constant electrical current load can accelerate these changes. This conditioning process allows the PV device to reach a desired current-voltage behavior during the manufacturing process. Further, cooling the PV device before removing the constant current load locks this desired current-voltage behavior in place, and ensures improved efficiency.

In some embodiments, electrical biasing can be combined with a lamination process, which has similar cycle times and can provide the heating required to invoke the necessary changes in current-voltage behavior. In a lamination process, thin film PV devices can be encapsulated within the device by materials designed to seal and hold the device together for many years and under a variety of conditions. The encapsulation material can help retain heavy metals present within the device by forming low solubility compounds that immobilize, chelate, adsorb, and/or fixate the cadmium and/or other heavy metals within the structure of the device to assist with handling and disposal. The lamination process includes heating the PV device, and pressing a PV device front substrate and a PV device back substrate together, with a PV device interlayer located between the front substrate and the back substrate. The heating of the PV device can include placing a PV device interlayer in contact with PV device substrates before heating the PV device and pressing the back substrate and the front substrate together. The lamination process can have a duration of, for example, 1 to 60 minutes, 1 to 30 minutes, 1 to 20 minutes, or 5 to 20 minutes.

The system can include a laminator configured to press a PV device front substrate and a PV device back substrate together, with a PV device interlayer between the front and back substrate, after a PV device is heated. The laminator can include a heater configured to heat a PV device to a temperature greater than 100° C. and a press configured to force PV device layers together. The system can include a conveyor to transport a PV device from the laminator. The laminator can be configured to laminate a PV device for between 1 to 20 minutes.

In one aspect, a method for manufacturing a PV device can include heating a PV device to a temperature above 100° C. and applying an electrical bias to the heated PV device. Applying an electrical bias to the PV device can take place after heating the PV device, or during heating of the PV device. Additionally, applying an electrical bias to the PV device can take place during the lamination process, or after the lamination process. Applying an electrical bias can have a duration longer than that of heating the PV device, shorter than that of heating the PV device, or substantially the same as that of heating the PV device. Applying the electrical bias can include supplying constant current with an upper voltage limit. Applying the electrical bias can include supplying constant voltage with an upper current limit. The electrical bias can generate a current that is in the range of about 0.1 to about 5 times the short circuit current of the PV device 101. The variable voltage to sustain the current can be between about 1V and about 200V. The step of applying the electrical bias can include applying the electrical bias for 1 to 60 minutes. The step of applying the electrical bias can include applying the electrical bias for 1 to 20 minutes. The step of applying the electrical bias can include applying the electrical bias for 5 to 20 minutes.

Heating the PV device can include heating the PV device to a temperature in the range of 100° to 220° C. Heating the PV device can include heating the PV device to a temperature in the range of 120° to 180° C. Heating the PV device can include heating the PV device to a temperature in the range of 120° to 160° C.

In one aspect, a system for manufacturing a PV device can include a conditioning station which is separate from a laminator including a heater configured to heat a PV device to a temperature greater than 100° C. and a power source configured to apply an electrical bias to the PV device. The heater can be configured to heat a PV device to a temperature in the range of 120° to 180° C. The power source can be configured to apply the electrical bias to a PV device subsequent to the heater heating the PV device. The power source can be configured to apply the electrical bias to a PV device simultaneous to the heater heating the PV device. The power source can be set at a constant current with an upper voltage limit. The power source can be set at a constant voltage with an upper current limit. The electrical bias can generate a current that is in the range of 0.3-5 times of the short circuit current of the PV device.

Referring to FIG. 1, one example of a PV device 101 is shown. PV device 101 can include front substrate 100. Front substrate 100 can include any suitable material, including glass, for example, soda-lime glass. One or more layers 110 can be deposited adjacent to front substrate 100, which can serve as a first substrate, on top of which various layers may be added. Layer(s) 110 can include one or more device layers. For example, layer(s) 110 can include one or more thin film PV device layers. PV device layers can further include a transparent conductive oxide layer adjacent to substrate 100, a semiconductor window layer adjacent to the transparent conductive oxide layer, and a semiconductor absorber layer adjacent to the semiconductor window layer. In some embodiments, layer(s) 110 can include a cadmium telluride (CdTe) absorber layer, a CIGS absorber layer, or an amorphous silicon semiconductor absorber layer. Layer(s) 110 can include any other suitable photovoltaic absorber material, including, for example, silicon.

The PV device described above can include other layers, for example, a barrier layer between the substrate and TCO layer, and a buffer layer between the TCO layer and window layer, and layers can be omitted from the PV device described. Further, layer(s) 110 can include additional metal layers adjacent to the semiconductor absorber layer. One or more metal immobilizing agents can be deposited adjacent to layer(s) 110. For example, a metal immobilizing agent 120 can be deposited adjacent to layer(s) 110.

Figure 2:
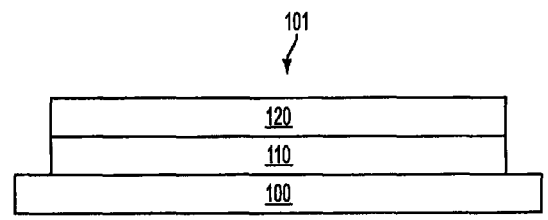
FIG. 2 is a cross-section of a PV device.

Portions of semiconductor material and other coatings can be deleted from the edges of a PV device constructed as a PV module, which may comprise a series of connected PV device cells. The semiconductor material can be removed from the edges by any suitable method. The area where the semiconductor material has been removed can be used to position, form, or deposit an interlayer material adjacent to the substrate. Referring to FIG. 2, portions of layer(s) 110 and layer(s) 120 have been removed from PV device 101 by mechanical means that can include laser scribing.

Figure 3:
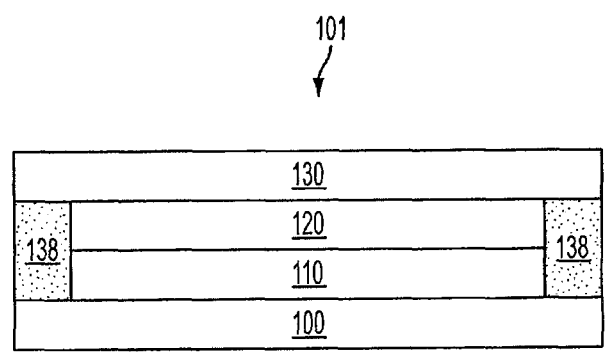
FIG. 3 is a cross-section of a PV device.

Referring to FIG. 3, PV device 101 can include one or more interlayers 138, in contact with layer(s) 110 and layer(s) 120. A PV device 101 can also include a back substrate 130. Back substrate 130 can include any suitable material, including glass, for example, soda-lime glass. Back substrate 130 can be added to PV device 101 after the addition of interlayers 138. Alternatively, back substrate 130 can be added to PV device 101 before interlayers 138 are added. For example, back substrate 130 can be positioned adjacent to layer(s) 110 and layer(s) 120 to form a space proximate to the edge portions of front substrate 100 and back substrate 130. Interlayer material can be positioned in this space to form interlayer 138.

The layers of PV device 101 can be aligned, heated, and bonded together by a lamination process. Lamination encapsulates the semiconductor layers, TCO, metal conductor, and any other layers of PV device 101, sealing the PV devices from the environment. The front substrate 100 and the back substrate 130 can be bonded together with interlayers 138 through a lamination process. The interlayers can include a thermoplastic interlayer. The thermoplastic interlayer can include an acrylonitrile butadiene styrene (ABS), an acrylic (PMMA), a celluloid, a cellulose acetate, a cycloolefin copolymer (COC), a polyvinyl butyral (PVB), a silicone, an epoxy, an ethylene-vinyl acetate (EVA), an ethylene vinyl alcohol (EVOH), a fluoroplastic (PTFE), an ionomer, KYDEX®, a liquid crystal polymer (LCP), a polyacetal (POM), a polyacrylate, a polyacrylonitrile (PAN), a polyamide (PA), a polyamide-imide (PAI), a polyaryletherketone (PAEK), a polybutadiene (PBD), a polybutylene (PB), a polybutylene terephthalate (PBT), a polycaprolactone (PCL), a polychlorotrifluoroethylene (PCTFE), a polyethylene terephthalate (PET), a polycyclohexylene dimethylene terephthalate (PCT), a polycarbonate (PC), a polyhydroxyalkanoate (PHA), a polyketone (PK), a polyester, polyethylene (PE), a polyetheretherketone (PEEK), a polyetherketoneketone (PEKK), a polyetherimide (PEI), a polyethersulfone (PES), a polyethylenechlorinate (PEC), a polyimide (PI), a polylactic acid (PLA), a polymethylpentene (PMP), a polyphenylene oxide (PPO), a polyphenylene sulfide (PPS), a polyphthalamide (PPA), a polypropylene (PP), a polystyrene (PS), a polysulfone (PSU), a polytrimethylene terephthalate (PTT), a polyurethane (PU), a polyvinyl acetate (PVA), a polyvinyl chloride (PVC), a polyvinylidene chloride (PVDC), or a styrene acrylonitrile (SAN), or any other suitable material, or any combination thereof. In certain embodiments, thermoplastic interlayer can include an ethylene vinyl acetate (EVA), a polyvinyl butyral (PVB), a silicone, or an epoxy.

Figure 4:
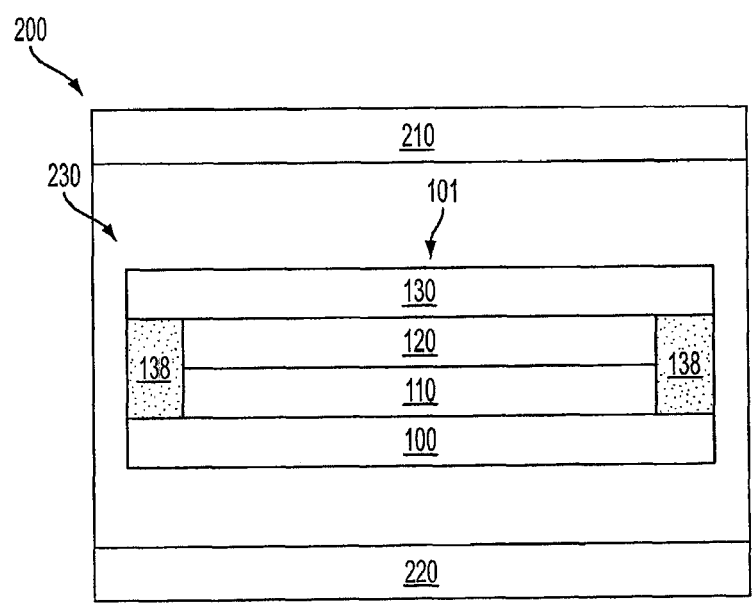
FIG. 4 is a cross-section of a system for manufacturing a PV device.

Referring to FIG. 4, front substrate 100, back substrate 130 and interlayer 138 of PV device 101 can be pressed together in laminator 200, which can include a press. Laminator 200 can treat PV device 101 in lamination chamber 230 by heating from the bottom heating plate 220 of laminator 200 that is facing front substrate 100 while the top plate 210 and bottom heating plates 220 of laminator 200 press front substrate 100 and back substrate 130 together. Interlayer 138 can be melted, allowed to flow and fill in gaps, and cured by this process. Lamination chamber 230 can be a vacuum chamber.

In some embodiments, PV device 101 can be heated with a source of infrared radiation (IR) in addition to treatment in laminator 200 in the lamination process. An IR heater can be used before or after interlayer 138 is added to PV device 101.

In some embodiments, the system can execute lamination and conditioning (e.g., heating and biasing of the PV device) in the same temperature cycle. Typical lamination temperature is in the range of 120°-180° C. for a time period of 5-20 minutes.

In this system, the electrical bias can be provided through an electrical power supply that is set at a constant current with an upper voltage limit or at a constant voltage with an upper current limit during the temperature cycle. The current can be in the range of 0.3-5 times the short circuit current of the PV device. The current can be in the range of 0.3-3 times the short circuit current of the PV device. In some embodiments, the system can provide lamination of the packaging and a conditioning of the PV device during a single temperature cycle through the application of an electrical bias during the temperature cycle of the lamination.

In some embodiments, the process of conditioning can occur through the application of electrical bias and heat after lamination. Indirect heat may be partially or completely provided by the lamination cycle. Typical device temperatures upon exit from lamination tool 200 can be 120°-160° C. and the bias can be applied while the temperature is maintained or ramped down from lamination temperatures. Process times can be in the range of 1-20 minutes.

Figure 5A:
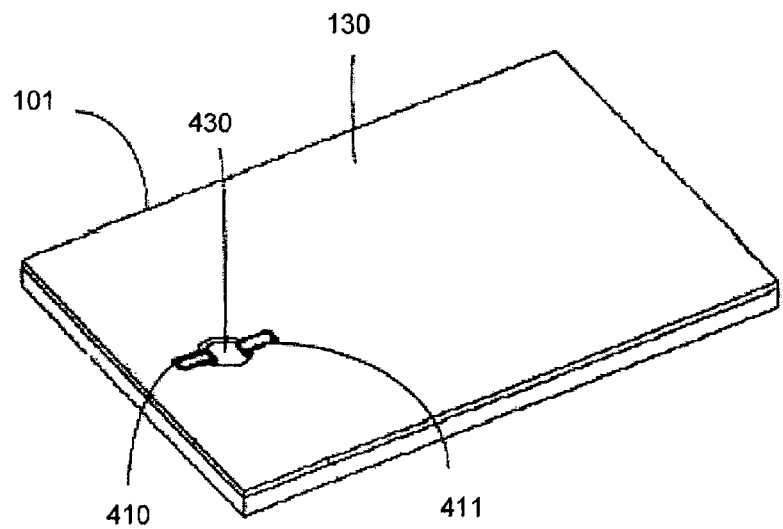
FIG. 5A is a perspective view of a PV device during manufacture.
Figure 5B:
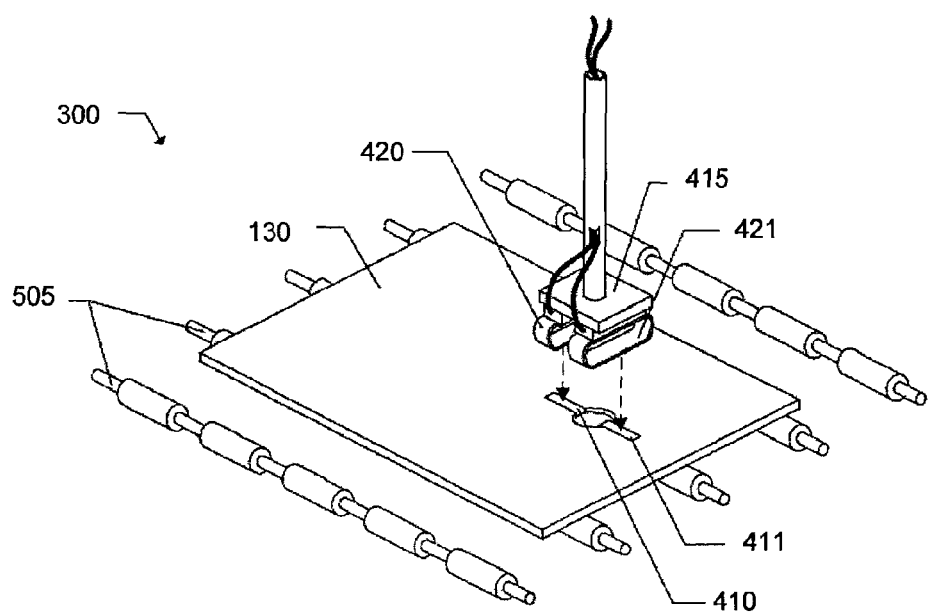
FIG. 5B is a perspective view of a portion of a system for manufacturing a PV device.

As shown in FIGS. 5A-B, the electrical bias can be applied to electrical contacts formed on the PV device 101. FIG. 5A shows the PV device 101 prior to biasing. During manufacturing of the PV devices 101, positive and negative lead foils 410 and 411, which are electrically connected to PV cells within device 101, are brought through the PV device 101 via a hole 430 in the back substrate 130 of the PV device 101. Positive and negative lead foils 410, 411 can be formed of any suitable material such as, gold, silver, copper, aluminum, or other conductive metals. In an embodiment, the positive and negative lead foils 410, 411 may be formed of conductive tape.

As shown in FIG. 5B, a biasing tool 415 with a first contact 420 and a second contact 421 can apply an electrical bias to the positive and negative lead foils 410, 411. In an embodiment, the biasing tool 415 can be mounted proximate to the conveyor 500, and may be capable of translating along, or rotating about, at least one axis. As a result, the biasing tool 415 can move and adjust to engage the positive and negative lead foils 410, 411 of the PV device 101. In an embodiment, the biasing tool 415 can move vertically into and out of contact with the lead foils 410, 411 located on a PV device 101. In another embodiment, the conveyor 500 can move a PV device 101 towards the stationary biasing tool 415, and stop the movement of a PV device 101 while the biasing tool 415 applies an electrical bias to a PV device 101. In an embodiment, a plurality of biasing tools 415 can apply an electrical bias to a respective plurality of PV devices 101 on the conveyor 500. The biasing tools 415 can be wired in series or in parallel to apply a bias to a plurality of PV devices connected in series or in parallel.

In some embodiments, the system can provide conditioning of the PV device 101 after completion of the lamination cycle. The conditioning process can maintain cycle time of the lamination tool and the devices can remain stationary after exit from lamination tool 200 during the process. No secondary heat source is required.

Applying an electrical bias to the PV device can take place before, after, or during heating of the lamination cycle. The length of applying an electrical bias to the PV device can be longer or shorter than that of heating of the lamination cycle. Applying an electrical bias to the PV device can have the same length of time as heating of the lamination cycle.

Figure 7:
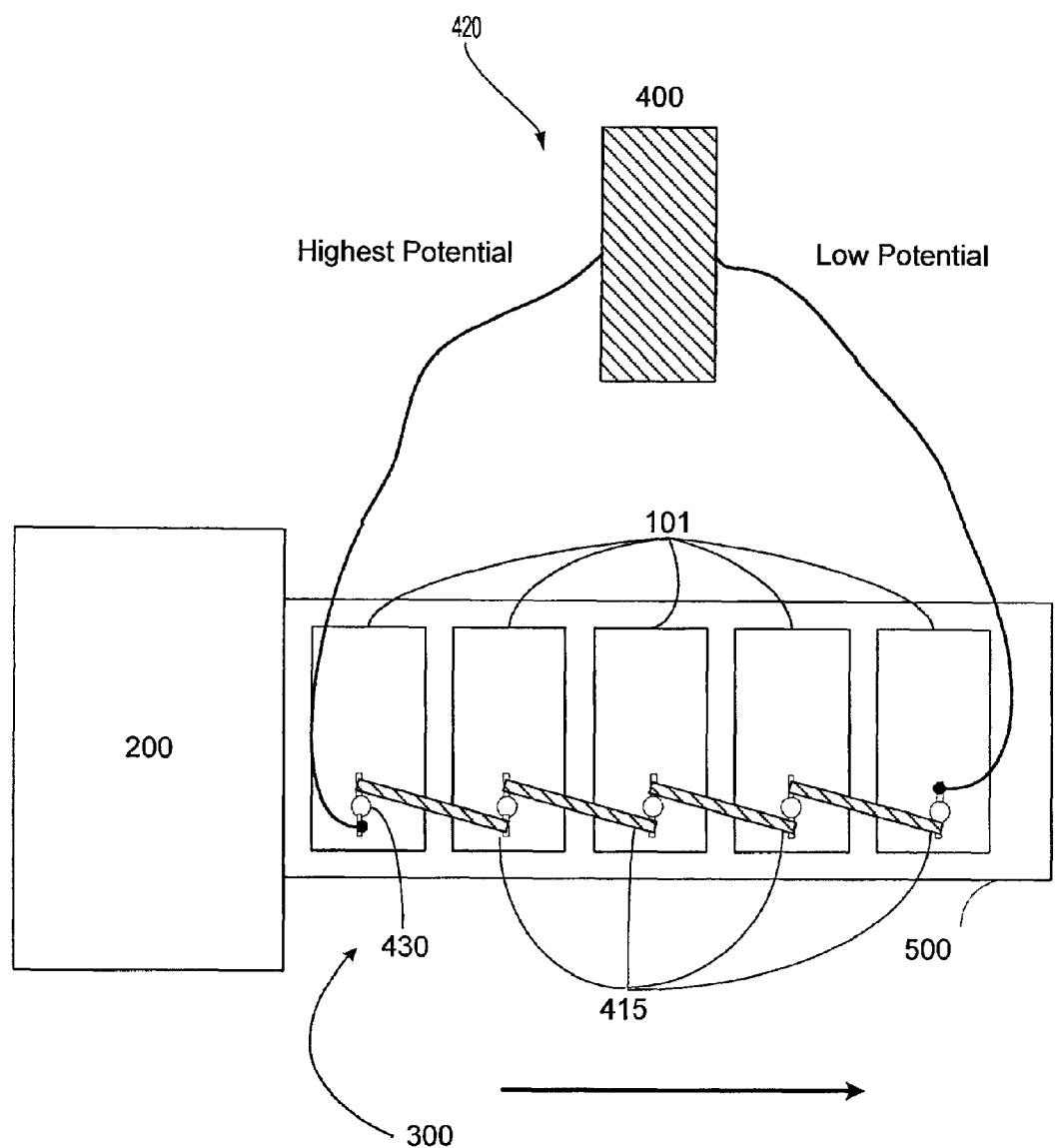
FIG. 7 is a top-down view of a system for manufacturing a PV device.

As shown in FIG. 7, in another embodiment, a system for manufacturing a PV device can include laminator 200, a separate conditioning station 300, a biasing system 420 which includes a power source 400 and a plurality of biasing tools 415, and conveyor 500. In this embodiment, conveyor 500 can transport PV devices 101 from one or more laminators 200 to the conditioning station 300 in the direction indicated by the arrow in FIG. 7. The conveyor 500 can transport the PV devices 101 into and out of the conditioning station 300. Laminator(s) 200 can include a heater to heat a PV device and a press to laminate a PV device, as discussed above.

Figure 6:
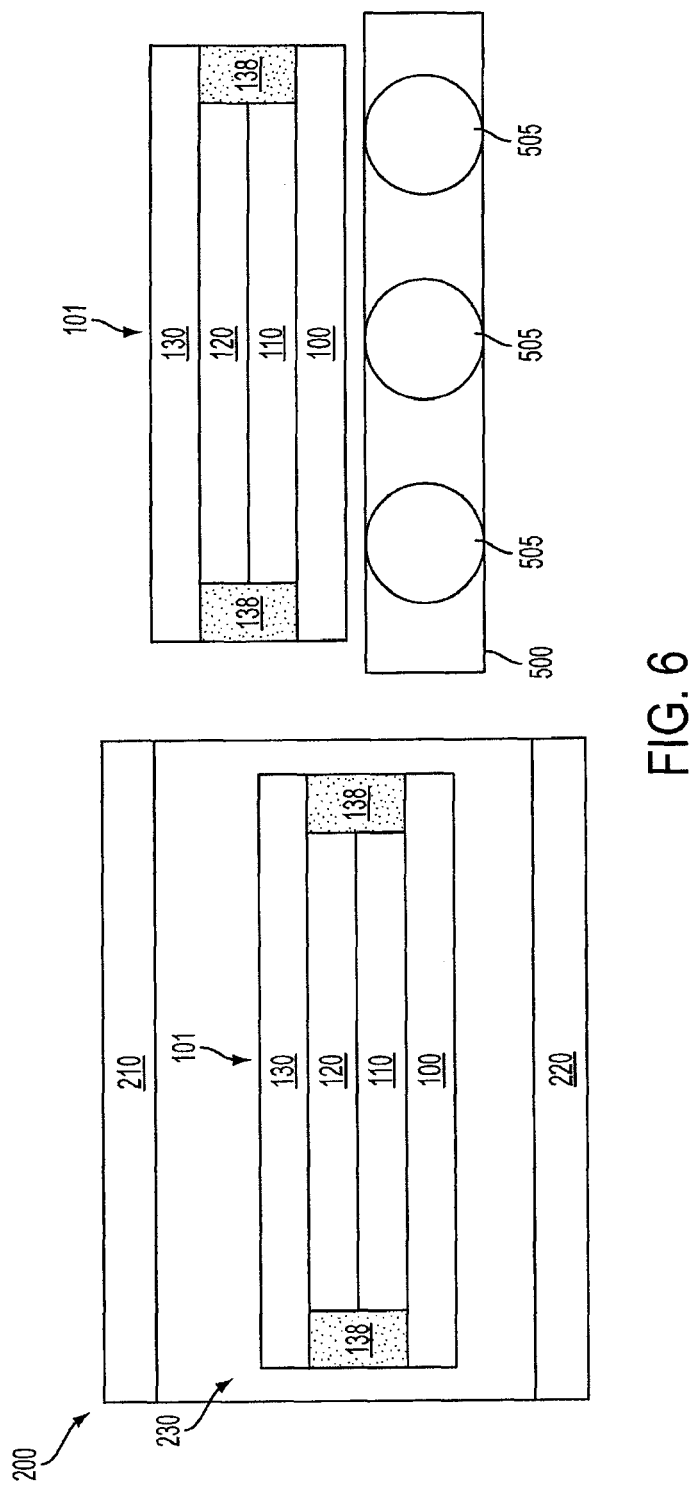
FIG. 6 is a cross-section of a system for manufacturing a PV device.

The embodiment shown in FIG. 7 can condition the PV device 101 after lamination occurs. Referring to FIGS. 6 and 7, in an exemplary embodiment the PV devices can be transported from one or more laminators 200 by a conveyor 500 with rollers 505 to a conditioning station 300 where they are held for conditioning. The heated PV devices can be positioned by conveyor 500 in conditioning station 300, at which electrical contacting and biasing can occur from power source 400 and through biasing tools 415.

In the embodiment shown in FIG. 7, a plurality of PV devices 101 can be connected in series or parallel and an electrical bias can be applied to the plurality of PV devices 101. Using respective biasing tools 415 (FIG. 5B) for electrical connection with a PV device 101, the biasing tools 415 can be wired to provide a series or parallel connection of PV devices 101. As described in FIG. 5A above, positive and negative lead foils 410, 411 can be formed on the PV device 101, and electrical contact pads of biasing tools 415 can be applied to one lead foil pair on each PV device 101 to place the PV devices 101 either in parallel or serial connection. FIG. 7 shows a serial connection of a plurality of PV devices 101. A high potential lead connected to the power source 400, which is part of a first biasing tool 415, can be connected to a lead foil of the first PV device 101, and a low potential lead connected by another biasing tool 415 to the power source 400 can be connected to a lead foil of the last PV device 101. Respective biasing tools 415 are used to make the series or parallel electrical connections of a plurality of PV devices 101. Power source 400 can be used to operate the devices in constant current or constant voltage mode.

A typical biasing process window can be a current in the range of 0.3-5 times (for example, 0.3-3 times) the short circuit current of the PV device and a processing time of application shorter than the lamination cycle. During this time PV device 101 can be actively heated, cooled, or simply exposed to ambient to achieve a desirable temperature profile. When devices of a previous PV device batch clear conditioning station 300, the lamination cycle completes on the next PV device batch and the next batch can enter conveyor 500 located next to conditioning station 300. A plurality of PV devices can be laminated one at a time, and transported by conveyor 500, or a plurality of laminators can each laminate a PV device and transport them to conditioning station 300.

As described above, conditioning of the photovoltaic modules by applying an electrical bias can occur while the photovoltaic module is being heated, or after the photovoltaic module has been heated. The conditioning which occurs at conditioning station 300 after the lamination process is conducted based on the temperature of the PV device 101 after lamination. PV devices 101 are at an elevated temperature from the lamination process; if needed, additional heat may be applied to the PV devices 101 at conditioning station 300. The PV device 101 that is conditioned by heating and applying an electrical bias can have about a 5-20 percent efficiency increase compared to unconditioned photovoltaic modules, for example, about a 15 percent improvement in efficiency. In some embodiments, the method of manufacturing by conditioning a PV device as described can achieve a reduction in the cost and time of production.

In addition, as shown in the exemplary embodiments of FIGS. 8-14, an electrical bias by the biasing tools 415 may be applied to one or more PV devices 101 in a temperature control chamber 1000 located at the conditioning station 300 (see FIG. 7). The temperature control chamber 1000 allows for precisely controlled heating of the PV device during conditioning at the conditioning station 300. The electrical biasing of the PV devices 101 in the temperature control chamber 1000 may be in lieu of, or in addition to, electrical biasing that can be applied during another processing step, for example, inside the laminator 200. The temperature control chamber 1000 controls the temperature of the PV devices 101 according to a temperature profile while electrical bias is applied by the biasing tools 415. Applying electrical bias in the temperature control chamber 1000 provides optimal thermal conditions for device biasing, such that the PV devices 101 are not exposed to the ambient or subject to other environmental changes. It has been observed that devices subject to electrical biasing according to a temperature profile using the system and method disclosed in FIGS. 8-14 possess improved reliability and performance characteristics, for example, improved photoconversion efficiency, and can provide more consistent PV device performance within different device batches.

Figure 8:
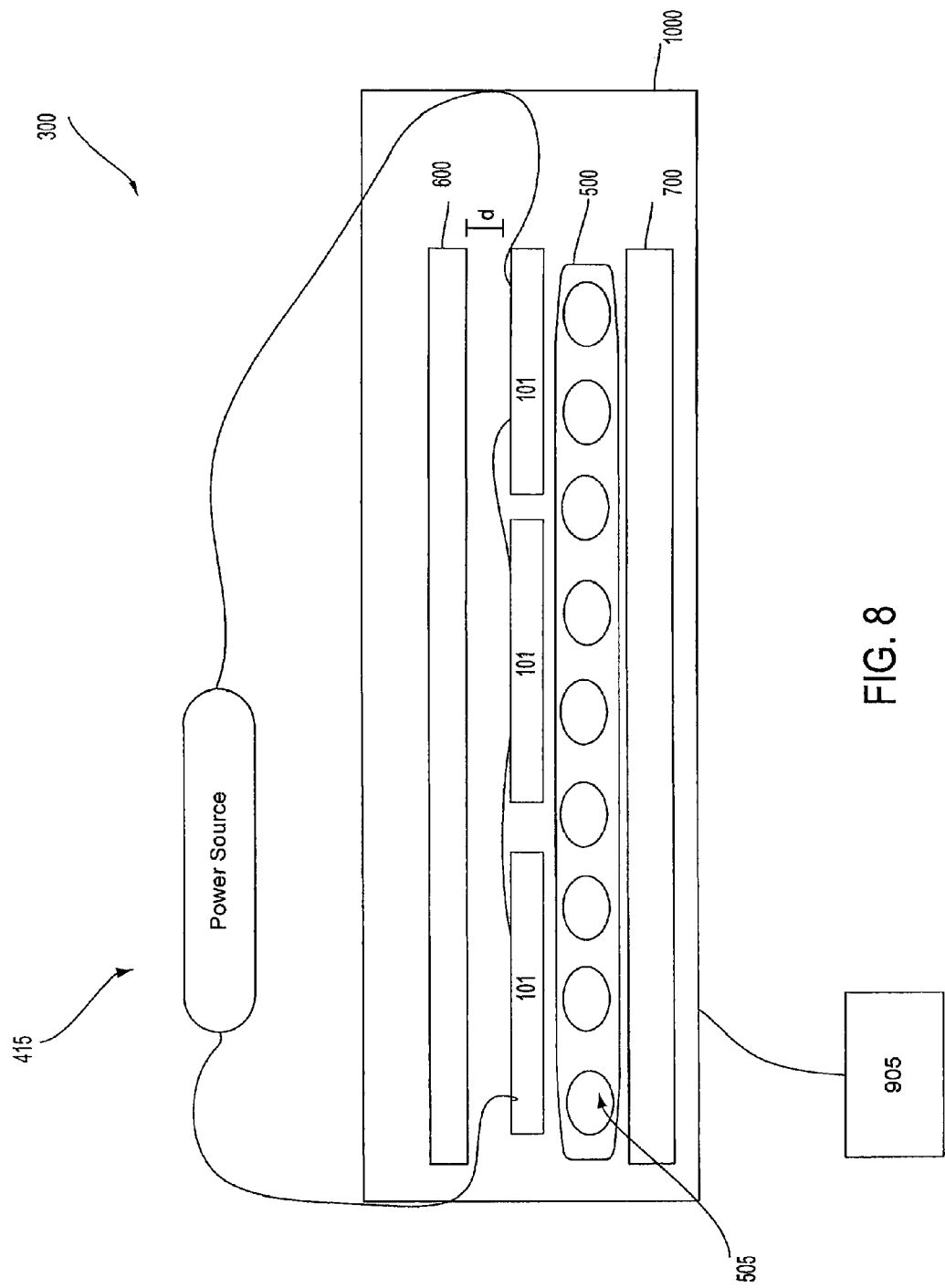
FIG. 8 is a cross-section of a temperature control chamber according to an exemplary embodiment.

FIG. 8 illustrates the temperature control chamber 1000 according to an embodiment. The PV devices 101 are shown as connected in series by biasing tools 415, however a single PV device 101 can also be conditioned within the temperature control chamber 1000, and a plurality of PV devices 101 can be connected in parallel by the biasing tools 415 for conditioning. The temperature control chamber 1000 can be a part of the PV device 101 manufacturing line or an independent chamber, used to apply an electrical bias and temperature conditioning according to a temperature profile to the PV device 101. For example, the temperature profile can include a plurality of phases, for example, a first hot phase and a second cool phase. The first hot phase can involve raising or lowering the temperature of the PV devices 101 to reach and maintain a first or setpoint temperature, for example, between about 100° C. and about 160° C. Raising or lowering the temperature of the PV devices 101 can be performed at a constant rate, or at a variable rate. The second cool phase can involve lowering the first or setpoint temperature of the PV devices 101 to reach and maintain a second temperature, for example, between about 80° C. and about 100° C. Lowering the temperature of the PV devices 101 can be performed at a constant rate, or at a variable rate. When the measured temperature of the PV devices 101 is at the second temperature, electrical biasing may be stopped. The temperature profile may also include temperature change rates over a specific time period during the hot and cool phases to achieve the first and second temperatures. The temperature profile may be predetermined based on product specifications or other parameters. One example of a temperature profile is discussed below with reference to FIGS. 11 and 12. The temperature control chamber 1000 may control the temperature of the PV devices 101 based on temperature feedback from the PV devices 101. Measuring the temperature of the PV devices can be performed by any known temperature measurement device, for example, using a radiation pyrometer.

In the FIG. 8 embodiment, a heat source 600, for example, one or more heater panels, is located above the PV devices 101 inside the temperature control chamber 1000. The heat source 600 can provide convective heat in close proximity to the PV devices 101, as shown in FIG. 8. Alternatively, the heat source 600 can provide conductive heat in direct contact with the PV devices 101, as described in more detail below with respect to FIG. 10. If the temperature control chamber 1000 is part of a PV device manufacturing line, a conveyor 500, which may be formed of a series of rollers 505, may transport the PV devices 101 through processing stations at desired traverse speeds. Multiple PV devices 101 can be transported on conveyor 500 at once, and placed in temperature control chamber 1000. The motion of conveyor 500 can be stopped at desired times to position the PV devices 101 at desired locations. An insulator 700, for example, one or more insulator panels, can be located below conveyor 500 inside the temperature control chamber 1000 to help control a temperature of the PV device 101. The insulator 700 may be located as close as possible to the conveyor 500 without restricting its motion. The insulator 700 can include an insulation panel made of, for example, ¼ inch of insulation on a ¼ inch support board. At least one heat source 600 and at least one insulator 700 can be positioned within the temperature control chamber 1000. In an embodiment, insulator 700 can be movable, for example, raised and lowered, in a manner similar to heat source 600, which is described in more detail below with respect to FIG. 9.

FIG. 8 also illustrates power source 400 used to power biasing tools 415 for application of an electrical bias to the PV devices 101, as described with respect to FIG. 7. An intelligent control system 905 can interface with an actuator 900, described with respect to FIG. 9, to position the heat source 600 relative to the PV devices 101. The control system 905 can also determine and supply the power to the heat source 600 required to bring the PV devices 101 to the appropriate temperature and control and maintain the temperature of the PV devices 101. Furthermore, the intelligent control system 905 can optionally position the insulator 700 via an actuator in order to bring the PV devices 101 to the appropriate temperature. In an embodiment, the intelligent control system 905 can coordinate and control the monitoring the temperature of the PV devices 101, the maintenance of the temperature profile, as well as the actuation and positioning of the heat source 600 or insulator 700.

Figure 9:
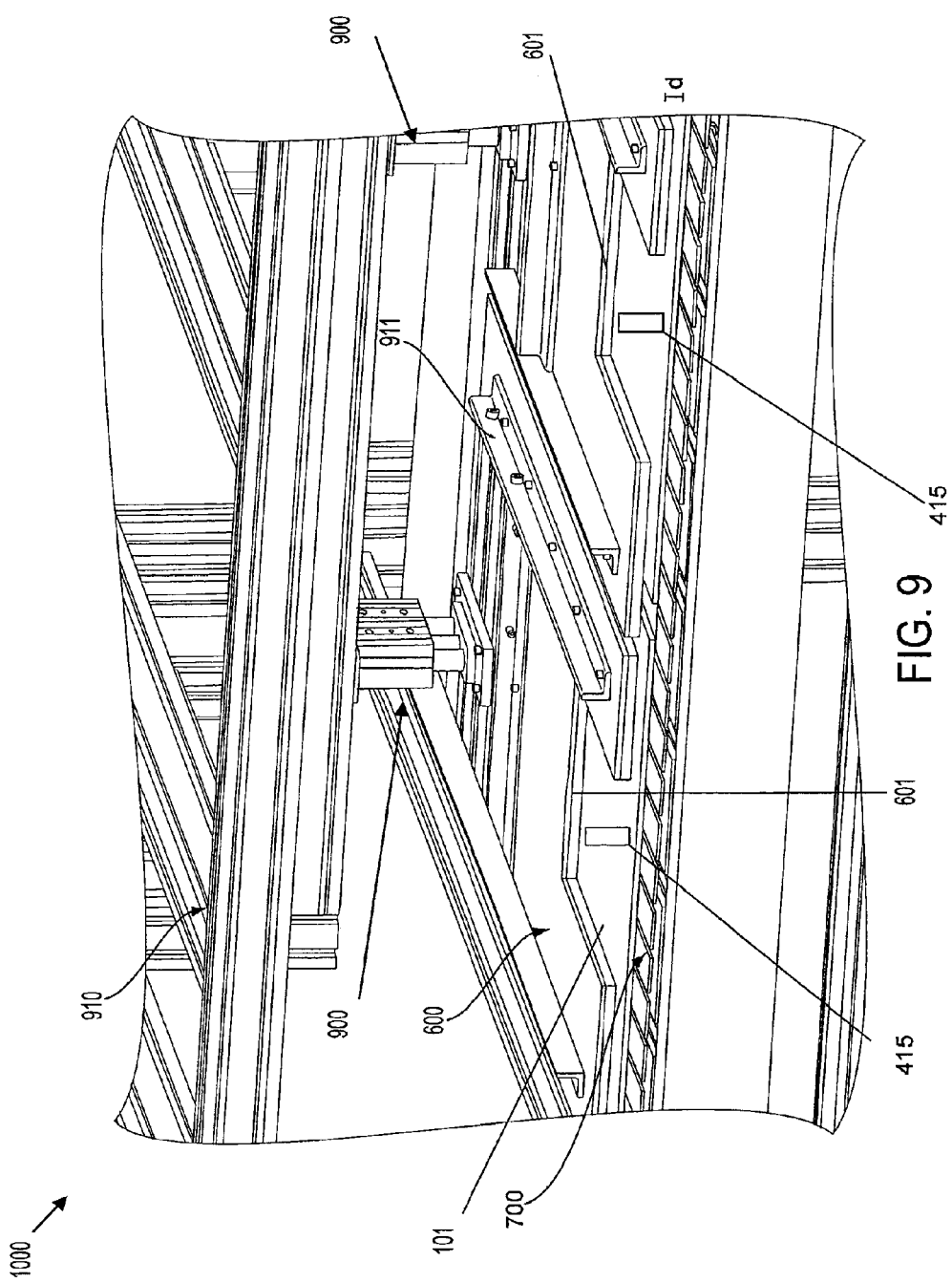
FIG. 9 is a perspective view of a temperature control chamber according to an exemplary embodiment.

FIG. 9 shows a perspective view of the temperature control chamber 1000, according to an embodiment. As shown in FIG. 9, the heat source 600 within the temperature control chamber 1000 can be moved, for example, raised and lowered, relative to the PV devices 101 by an actuator 900. The actuator 900 is connected to the heat source 600. The actuator 900 is supported by one or more actuator support members 910. Actuator 900 can include one or more guided cylinders, which can comprise air cylinders, linear cylinders, or any other actuation means. The heat source 600 can be supported by one or more heat source support members 911. The heat source 600 can be positioned to contact with or be spaced from the back substrate 130 (the back substrate 130 is shown in FIG. 3) of the PV device 101. Alternatively, the heat source 600 can be positioned to contact with or be spaced from the front substrate 100 (the front substrate 100 is shown in FIG. 3) of the PV device 101. For example, when convective heat is applied to the PV devices 101, the heat source 600 can be raised a distance (d), for example, between about 1 and about 2 inches away from the PV device 101. Alternatively, when conductive heat is applied to the PV devices 101, the heat source 600 can be placed in contact with the PV devices 101. The heat source 600 can also be raised to reduce the temperature of the PV device 101, and can be raised and turned off to cool the PV device 101. The heat source 600 can have a power density of between about 1 and about 5 W/in$^2$. The power density of heat source 600 can be a function of the amount of insulator 700 is used. The insulator 700 may also be actuated by an actuator to be positioned a desired distance relative to the PV device 101, similar to actuator 900 for the heat source 600. As shown in FIG. 9, cutouts 601 in the heat source 600 can be formed to allow the biasing tools 415 to connect with the lead foils 410, 411 of respective PV devices 101.

Figure 10:
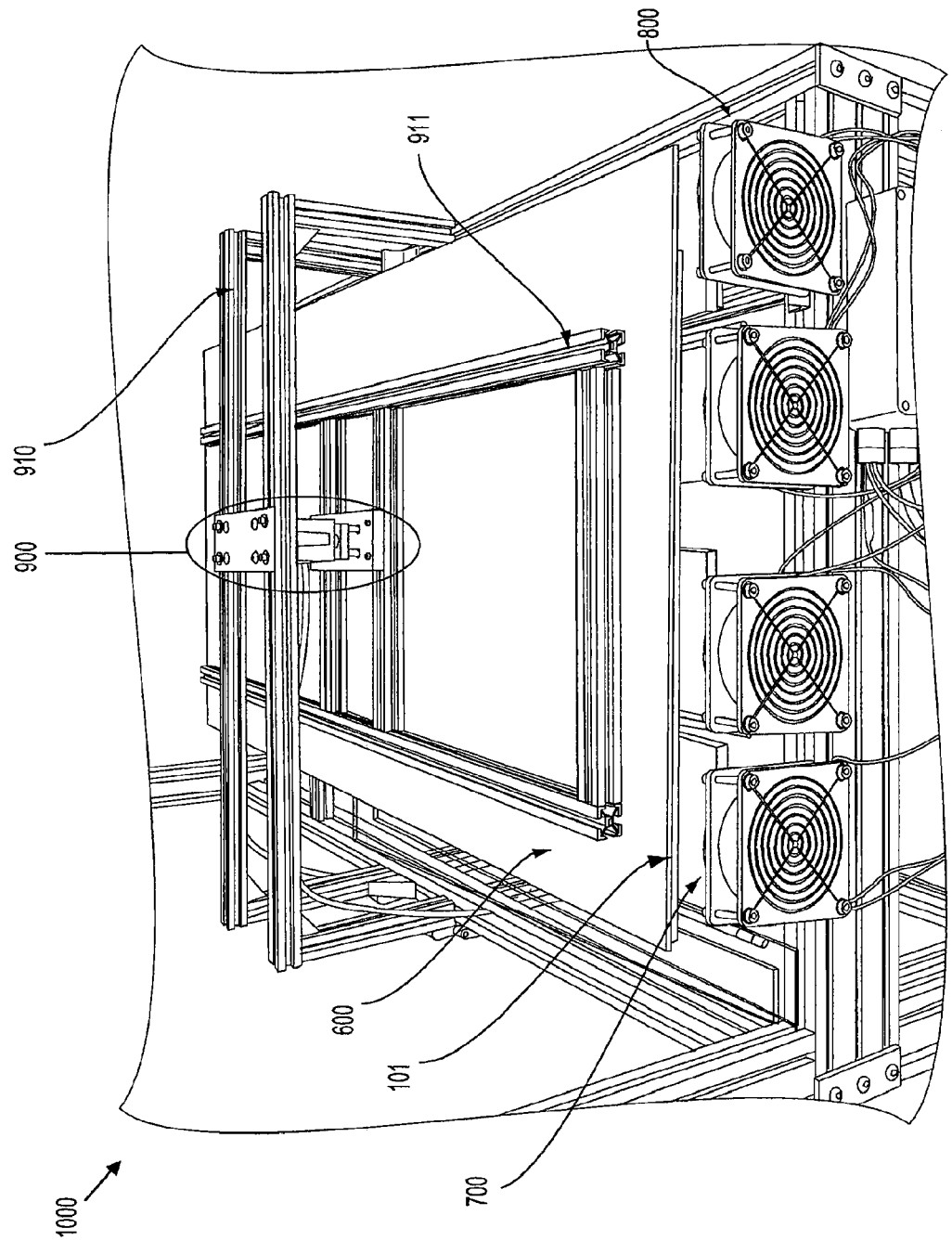
FIG. 10 is another perspective view of a temperature control chamber according to an exemplary embodiment.

FIG. 10 illustrates another perspective view of the temperature control chamber 1000. The temperature control chamber 1000 of FIG. 10 is the same as that of FIGS. 8 and 9, except that FIG. 10 shows the heat source 600 and a cooling source 800. The cooling source 800, for example, one or more electrical fans, may be located within the temperature control chamber 1000. The cooling source 800 can be placed near the PV device 101 to cool the PV device 101 during the cool phase. As shown in FIG. 10, the cooling source 800 can be placed on one or more sides of the PV devices 101 to cool the PV devices 101 by forced air convection with cooling air flow traveling in a direction parallel to a surface of the PV devices 101. Cooling source 800 can be fixed in one position, with control system 905 adjusting power to the cooling source 800. In an alternative embodiment, the cooling source 800 can be mounted proximate to the conveyor 500, and may be capable of translating along, or rotating about, at least one axis, and control system 905 can adjust the position of cooling source 800. At least one cooling source 800 may be positioned within the temperature control chamber 1000.

Figure 11:
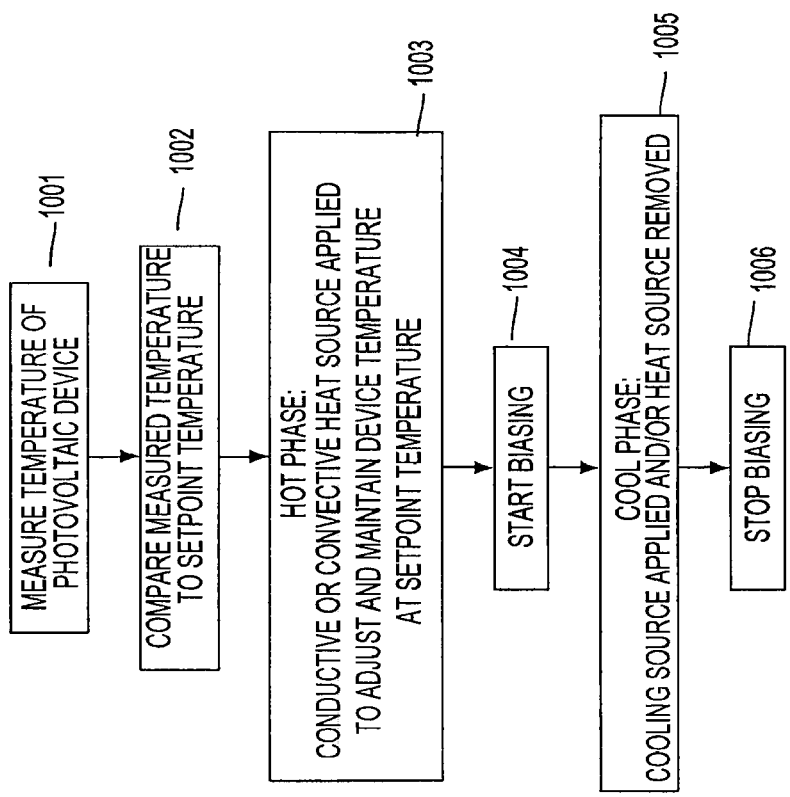
FIG. 11 is a process flow chart of a method of conditioning a PV device according to an exemplary embodiment.

FIG. 11 illustrates a process flow chart of a method of conditioning the PV device 101, according to an embodiment. The method of conditioning can include measuring the temperature of the PV device 101 as it enters the temperature control chamber 1000 at step 1001, using, for example, a radiation pyrometer and comparing the measured temperature to a first predetermined setpoint temperature at step 1002, controlling the temperature of the PV device to the first predetermined setpoint temperature at step 1003, electrically biasing the PV device 101 at step 1004, cooling the PV device 101 to a second predetermined setpoint temperature at step 1005, and removing the electrical bias at step 1006. Electrical biasing at step 1004 of the photovoltaic device may begin during any portion of step 1003, and may stop during any portion of step 1005.

As shown in FIG. 11, the temperature control chamber 1000 can control the temperature of the PV device 101 in a plurality of phases; for example, a hot phase at step 1003 and a cool phase at step 1005. During the hot phase, the temperature of the PV devices 101 is controlled in order to reach and maintain the temperature of the PV devices 101 at a first setpoint temperature, for example, between about 100° C. and about 160° C. The first setpoint temperature can be as high as possible, being only limited by the temperature that the materials, for example, the interlayer 138 material described in connection with FIG. 3, can sustain. During the hot phase, the temperature control chamber 1000 can increase, decrease, and/or maintain the temperature of the PV devices 101 based on the measured temperature of the PV devices 101 as it entered the temperature control chamber 1000 in step 1001 and the first setpoint temperature. The desired temperature can be achieved by adjusting the position and/or power to heat source 600, or the position of insulator 700, operated by the control system 905 (FIG. 8) and the actuator 900 (FIGS. 9 and 10). For example, during the hot phase, the temperature control chamber 1000 can increase or decrease the temperature of the PV devices 101 at a rate of up to about 10° C./min, and maintain a device temperature of about 130° C. The rate of increase or decrease in the temperature of the PV devices 101 can be a constant or variable rate. The hot phase may last for a period of up to about 5 minutes, or any other suitable time period depending on the specifications of the materials of the PV devices 101. The electrical biasing at step 1004 can take place in whole or in part during the hot phase.

Before the electrical biasing at step 1004 is completed, the cool phase at step 1005 may take place. During the cool phase, the temperature control chamber 1000 cools the PV devices 101. The desired PV device 101 temperature can be achieved by adjusting the position and power to heat source 600, the position of insulator 700, or the position and power to cooling source 800. For example, the temperature control chamber 1000 can cool the PV devices 101 at a rate of between about 5° C./min and about 30° C./min, to reach a second setpoint temperature of between about 80° C. and about 100° C., for example. The rate of cooling can be a constant or variable rate. The cool phase may last for a period of up to about 5 minutes, or any other suitable time period depending on the thermal specifications of PV devices 101 and/or the maximum thermal stress that the PV devices 101 materials can withstand. For example, once the cool phase is completed, electrical biasing can be stopped.

Figure 12:
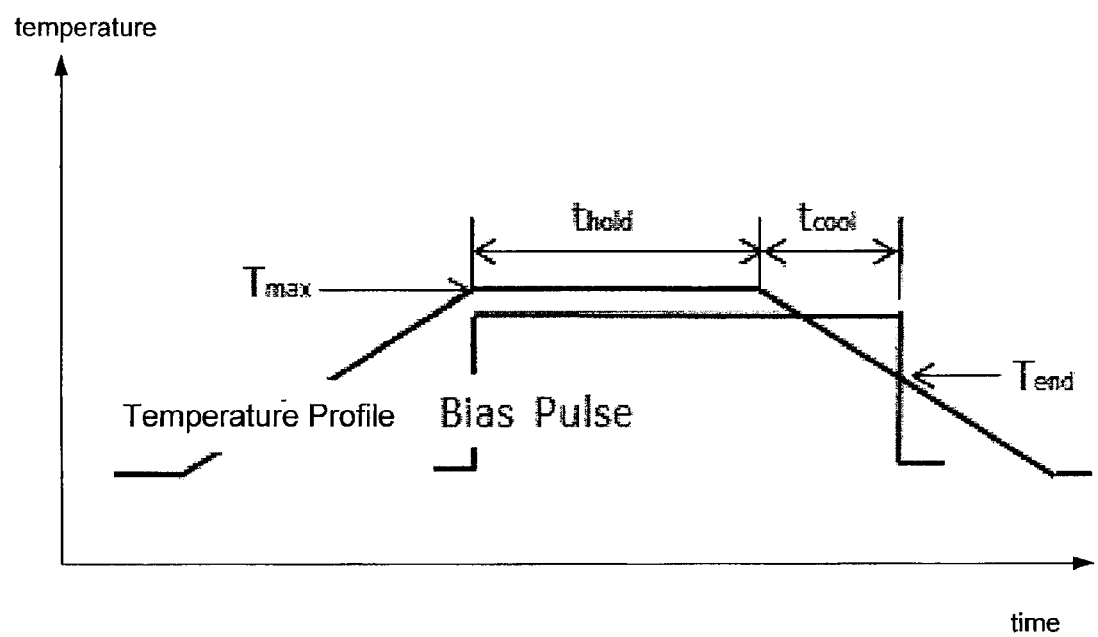
FIG. 12 is a chart of a temperature profile according to an exemplary embodiment.

FIG. 12 illustrates a temperature profile which can be used in chamber 1000 according to an exemplary embodiment. The temperature control can consist of increasing the temperature of one or more PV devices 101 within temperature control chamber 1000, for example at a constant rate of about 0° to about 10° C./min, to a temperature ($T_{max}$), when an electrical bias pulse of a predetermined voltage and current is applied to one or more PV devices 101. The temperature of a PV device 101 can then be held at that temperature for a period of time ($t_{hold}$), while biasing is applied. Before the biasing is completed, a PV device 101 can be cooled at a constant rate, for example, about 5° to about 30° C./min, to reach a temperature ($T_{end}$), over a period of time ($t_{cool}$). The bias pulse ends at the temperature $T_{end}$. The temperature $T_{max}$ can, for example, be in the range of about 100° to about 160° C. The temperature $T_{end}$ can, for example, be in the range of about 80° to about 100° C. The time $t_{hold}$ can, for example, be about 4 minutes, and the time $t_{cool}$ can, for example, be about 3 minutes.

Figure 13:
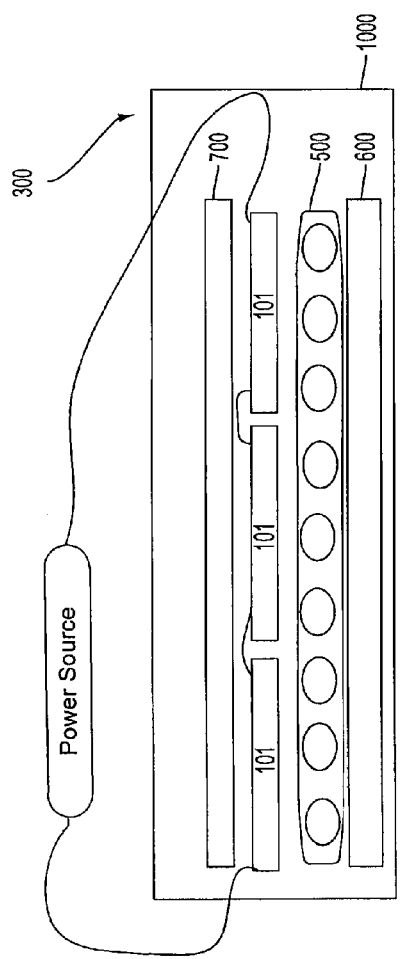
FIG. 13 is a cross-section of a temperature control chamber according to an exemplary embodiment.

FIG. 13 illustrates another embodiment of the temperature control chamber 1000. The temperature control chamber 1000 of FIG. 13 is the same as that of FIGS. 8-10, except that the heat source 600 is located below the PV device 101 and the conveyor 500. The insulator 700 can be located above the PV device 101, and can be positioned to face, and/or contact, the PV device 101, similar to the heat source 600 described with respect to FIGS. 8-10. Heat source 600 and insulator 700 can be movable by respective actuators, as described above. Electrical biasing can be applied by biasing tool 415 in the manner as that described with reference to FIGS. 5A-B and 7.

Figure 14:
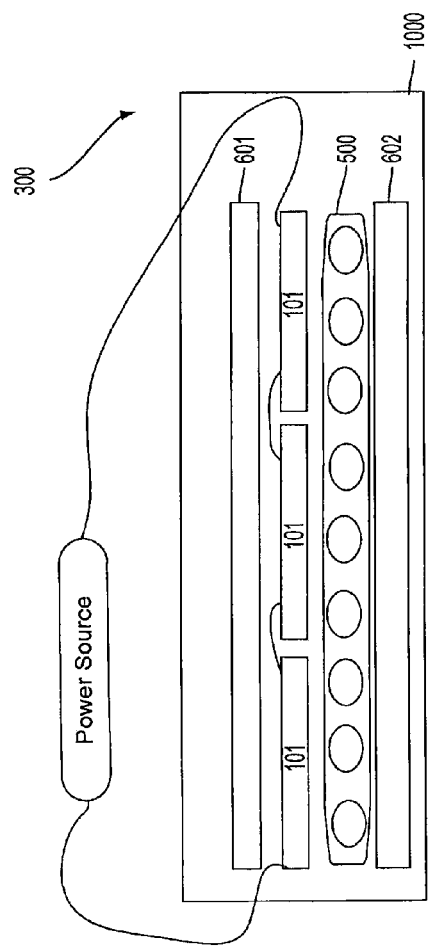
FIG. 14 is a cross-section of a temperature control chamber according to an exemplary embodiment.

FIG. 14 illustrates another embodiment of the temperature control chamber 1000. The temperature control chamber 1000 of FIG. 14 is the same as that of FIGS. 8-10, except that the heat source 600 includes two or more heater panels 601, 602 located above and below the PV device 101, respectively. Heater panel 601 can be operated the same as the heat source 600 described with respect to FIG. 8, and raised or lowered relative to, and/or placed in contact with, the PV device 101. Heater panel 602 can be raised and lowered and placed as close as possible to the conveyor 500 without restricting its movement. Insulators 700, as shown in FIG. 9, may be located above heater panel 601 and/or below heater panel 602, and can be movable by an actuator, as described above. Electrical biasing can be applied by biasing tool 415 in the manner as that described with reference to FIGS. 5A-B and 7.

A number of embodiments of the invention have been described. Nevertheless, it will be understood that various modifications may be made without departing from the spirit and scope of the invention. It should also be understood that the appended drawings are not necessarily to scale, presenting a somewhat simplified representation of various preferred features illustrative of the basic principles of the invention.

What is claimed is:

1. A method for conditioning a photovoltaic device having external electrical contacts during manufacture comprising:
   controlling the temperature of the photovoltaic device according to a temperature profile; and
   applying an electrical bias from a power source to the electrical contacts of the photovoltaic device having the controlled temperature;
   wherein the step of controlling the temperature according to a temperature profile further comprises:
      heating the photovoltaic device to a first temperature; and
      cooling the photovoltaic device to a second temperature, wherein the electrical bias is removed when the photovoltaic device reaches the second temperature.

2. The method of claim 1, wherein the temperature profile comprises at least one hot phase and at least one cool phase.

3. The method of claim 1, wherein the step of controlling the temperature of the photovoltaic device according to a temperature profile comprises:
   maintaining a temperature of the photovoltaic device at the flail first temperature while applying an electrical bias.

4. The method of claim 1, wherein the step of controlling the temperature of the photovoltaic device according to a temperature profile comprises:
   applying convective or conductive heat to the photovoltaic device.

5. The method of claim 1, wherein the first temperature is between about 100° C. and about 160° C., and the second temperature is between about 80° C. and about 100° C.

6. The method of claim 1, wherein the step of controlling the temperature of the photovoltaic device according to a temperature profile comprises:
   adjusting the temperature of the photovoltaic device at a rate of about 0°-10° C./min, to achieve at least a portion of the temperature profile.

7. The method of claim 1, wherein the step of controlling the temperature of the photovoltaic device according to a temperature profile comprises:
   decreasing the temperature of the photovoltaic device at a rate of about 5°-30° C./min, to achieve at least a portion of the temperature profile.

8. The method of claim 1, wherein the step of controlling the temperature of the photovoltaic device according to a temperature profile comprises:
   controlling the position or the power to a heat source.

9. The method of claim 1, wherein the step of controlling the temperature of the photovoltaic device according to a temperature profile comprises:
   controlling the position or the power to a cooling source.

10. The method of claim 1, wherein the step of controlling the temperature of the photovoltaic device according to a temperature profile comprises:
    controlling the position of an insulator.

11. The method of claim 1, further comprising:
    laminating the photovoltaic device before applying an electrical bias to the photovoltaic device having the controlled temperature.

12. A method for conditioning a photovoltaic device during manufacture comprising:
    controlling the temperature of the photovoltaic device according to a temperature profile; and
    applying an electrical bias to the photovoltaic device having the controlled temperature,
    wherein the temperature profile has at least one cool phase and at least one hot phase, and
    removing the electrical bias when the temperature profile is complete.

13. The method of claim 12, wherein applying an electrical bias to the photovoltaic device having the controlled temperature takes place during at least a portion of the hot phase.

14. The method of claim 12, wherein the temperature profile comprises adjusting the temperature at a constant rate during at least a portion of one of the hot phase and the cool phase.

15. The method of claim 14, wherein the hot phase comprises:
    increasing or decreasing the temperature of the photovoltaic device at a rate of about 0°-10° C./min.

16. The method of claim 14, wherein the cool phase comprises:
    decreasing the temperature of the photovoltaic device at a rate of about 5°-30° C./min.

17. The method of claim 14, wherein adjusting the temperature at a constant rate during at least a portion of the hot phase comprises:
    controlling the position of or power to a heat source.

18. The method of claim 14, wherein adjusting the temperature at a constant rate during at least a portion of the cool phase comprises:

controlling the position of or power to a cooling source.

19. The method of claim 12, further comprising laminating the photovoltaic device before applying an electrical bias to the photovoltaic device having the controlled temperature.

20. The method of claim 12, wherein applying an electrical bias to the photovoltaic device having the controlled temperature is not completed until the completion of the cool phase.

* * * * *